United States Patent
Su et al.

(10) Patent No.: US 9,602,099 B2
(45) Date of Patent: Mar. 21, 2017

(54) ADAPTIVE DUO-GATE MOSFET

(71) Applicants: Jiong-Guang Su, Hsinchu County (TW); Hung-Wen Chou, Hsinchu County (TW)

(72) Inventors: Jiong-Guang Su, Hsinchu County (TW); Hung-Wen Chou, Hsinchu County (TW)

( * ) Notice: Subject to any disclaimer, the term of this patent is extended or adjusted under 35 U.S.C. 154(b) by 0 days.

(21) Appl. No.: 14/850,982

(22) Filed: Sep. 11, 2015

(65) Prior Publication Data

US 2016/0344383 A1    Nov. 24, 2016

(30) Foreign Application Priority Data

May 21, 2015    (TW) .............................. 104116283 A

(51) Int. Cl.
  *H03K 17/687* (2006.01)
  *H01L 29/78* (2006.01)
(52) U.S. Cl.
  CPC ....... *H03K 17/687* (2013.01); *H01L 29/7813* (2013.01); *H03K 2017/6878* (2013.01)
(58) Field of Classification Search
  CPC ..... H01L 29/00; H01L 29/7813; H03K 17/00; H03K 17/04123; H03K 17/063; H03K 17/168; H03K 17/687; H03K 17/6874; H03K 2017/00; H03K 2017/6878
  USPC ......................................................... 327/434
  See application file for complete search history.

(56) References Cited

U.S. PATENT DOCUMENTS

| 6,870,217 B2 | 3/2005 | Elbanhawy |
| 7,195,979 B2 | 3/2007 | Elbanhawy |
| 2003/0079163 A1* | 4/2003 | Hashimoto ......... G06F 11/0721 714/55 |
| 2004/0135201 A1* | 7/2004 | Elbanhawy ........... H01L 29/402 257/335 |
| 2006/0214222 A1* | 9/2006 | Challa ................. H01L 21/3065 257/328 |
| 2008/0048709 A1* | 2/2008 | Lee ........................ G09G 3/006 324/760.02 |
| 2009/0278186 A1* | 11/2009 | Sonsky ............. H01L 21/28273 257/316 |

OTHER PUBLICATIONS

B. Jayant Baliga, " CC-MOSFET Structure," Advanced Power MOSFET Concepts, Jun. 26, 2010, pp. 159-193.

* cited by examiner

*Primary Examiner* — Lincoln Donovan
*Assistant Examiner* — David Mattison
(74) *Attorney, Agent, or Firm* — Jianq Chyun IP Office

(57) ABSTRACT

An adaptive duo-gate MOSFET includes a trench MOSFET and an adaptive element. The trench MOSFET includes a source, a drain, a first gate, a second gate, and a dielectric layer between the first and second gates. Herein, the first gate may generate charge-coupling in blocking operation, and the second gate may form channel in the trench MOSFET when in conduction operation. The adaptive element is electrically coupled to the first gate, the second gate, and the source respectively. When a potential difference between the second gate and the source is larger than a predetermined value, the first gate and the source are electrically disconnected and then the first gate and the second gate are electrically connected. After a predetermined time, the first gate and the second gate are electrically disconnected and then the first gate and the source are electrically connected.

12 Claims, 6 Drawing Sheets

ADAPTIVE DUO-GATE MOSFET

CROSS-REFERENCE TO RELATED APPLICATION

This application claims the priority benefit of Taiwan application no. 104116283, filed on May 21, 2015. The entirety of the above-mentioned patent application is hereby incorporated by reference herein and made a part of this specification.

BACKGROUND OF THE INVENTION

1. Field of the Invention

The invention generally relates to a trench MOSFET, and more particularly, to an adaptive duo-gate MOSFET.

2. Description of Related Art

Switching-mode circuit with its excellent power efficiency has been widely used in the control for power supply. In order to achieve the optimal power efficiency, an input power loss and an output power loss must be reduced. The two main factors resulting in the output power loss are conduction loss and switching loss of the output stage power MOSFET.

In recent years, trench MOSFET has been widely used because it has the characteristic of high component density per unit chip area. This characteristic may effectively decrease the turn-on resistance of the MOSFET under the same chip area. However, in order for the trench MOSFET to be used in a high voltage operation, an N-type epitaxial layer in the drain has to decrease in doping concentration with increase in thickness, therefore, the turn-on resistance of the trench MOSFET is increased.

Recently, an improved trench MOSFET known as Charge-Coupling MOSFET (CC-MOSFET) is capable of solving the aforesaid problem. This type of transistor extends the gate to the N-type epitaxial layer, so during the blocking operation in the transistor, the electric field with a two-dimensional charge balance may be generated to increase the breakdown voltage of the MOSFET. Since this structure enables an N-type epitaxial layer having higher doping concentration, which is prepared for a low breakdown voltage application, to be used in a higher breakdown voltage application, in terms for the CC-MOSFET having the higher breakdown voltage, the turn-on resistance thereof will be lower than the traditional trench MOSFET having the same breakdown voltage.

However, because the portion of the gate that extends to the N-type epitaxial layer will generate a capacitance with the surrounding oxide layer (isolation structure) and the N-type epitaxial layer, a capacitance from the gate to the drain is increased resulting in the extension in a switching time of the CC-MOSFET, and thereby leads to an increase in the switching loss.

Therefore, an improved CC-MOSFET known as split-gate MOSFET or shielded-gate MOSFET has been introduced. This type of transistor isolates the portion of the gate that extends to the N-type epitaxial layer from a portion that originally existed at a P-type well by an inter-poly dielectric (IPD) layer, so as to separate the potentials of the two portions of the gate. The portion of the gate located in the N-type epitaxial layer is electrically coupled to the potential of the source through metal interconnection for generating the two-dimensional charge balance under the blocking operation, and the high capacitance problem caused by the CC-MOSFET can be solved with the inter-poly dielectric layer, thus reducing the switching loss.

However, because the potential of the gate located in the N-type epitaxial layer is the same as that of the source, when device is operated in a conduction state, this gate, as being similar to the source, will also be at the lowest potential and thereby unable to accumulate electrons, and thus the resulting turn-on resistance will be higher than that of the CC-MOSFET.

SUMMARY OF THE INVENTION

The invention provides an adaptive duo-gate MOSFET capable of simultaneously reducing conduction loss and switching loss. A power efficiency of a switching-mode circuit system can be enhanced by the adaptive duo-gate MOSFET.

The invention further provides an operating method for the adaptive duo-gate MOSFET, which can adaptively regulate the transistor so as to achieve an effect of reducing the conduction loss and the switching loss under different states.

The adaptive duo-gate MOSFET of the invention includes a trench MOSFET and an adaptive element. The trench MOSFET includes a substrate, a source, a drain, a first gate, a second gate, and a dielectric layer between the first gate and the second gate. The source and the drain are respectively located at two ends of a trench in the substrate, and the first and the second gates and the dielectric layer are all located in the trench. The first gate is configured to generate charge-coupling in the substrate, and the second gate is configured to form a channel in the trench MOSFET. The adaptive element is electrically coupled to the first and the second gates and the source, respectively. When a potential difference between the second gate and the source is greater than a first predetermined value, the first gate and the source are electrically disconnected by the adaptive element, and then the first and the second gates are electrically connected by the adaptive element. Moreover, after a predetermined time, through the adaptive element, the first and the second gates are electrically disconnected and then the first gate and the source are electrically connected.

In one embodiment of the invention, the adaptive element includes a first switching element, a second switching element and a control circuit. The first switching element is coupled to the first gate and the second gate, respectively, and the second switching element is coupled to the first gate and the source respectively. The control circuit determines the ON and OFF of the first switching element and the second switching element according to the potential difference between the second gate and the source.

In one embodiment of the invention, the adaptive element further includes a potential detection element for detecting potentials of the second gate and the source and generating a potential difference signal to the control circuit.

In one embodiment of the invention, the adaptive duo-gate MOSFET further includes a clock coupled to the adaptive element. The clock starts counting the predetermined time after the first gate and the second gate are electrically connected, and the first gate and the second gate are electrically disconnected after the clock finishes counting the predetermined time.

In one embodiment of the invention, a finishing time point of the predetermined time is when the potential difference between the second gate and the source is smaller than a second predetermined value.

In one embodiment of the invention, the second predetermined value is larger than the first predetermined value.

In one embodiment of the invention, the second predetermined value is equal to the first predetermined value.

In an embodiment of the invention, the dielectric layer comprises an inter-poly dielectric (IPD) layer.

In one embodiment of the invention, the second gate is located on the first gate and nearby the source.

In one embodiment of the invention, the first gate is located in the trench and exposed from a top surface of the trench, and the second gate is a plurality of conductive layers respectively located at two sides of the first gate.

The operating method for the adaptive duo-gate MOSFET of the invention includes obtaining the potential difference between the second gate and the source of the trench MOSFET; electrically disconnecting the first gate and the source when the potential difference is greater than the first predetermined value; electrically connecting the first gate and the second gate after the first gate and the source are disconnected; electrically disconnecting the first gate and the second gate after a predetermined time; and electrically connecting the first gate and the source after the first gate and the second gate are disconnected.

In another embodiment of the invention, the operating method further includes maintaining a connected state between the first gate and the source and a disconnected state between the first gate and the second gate when the potential difference is smaller than the first predetermined value.

In another embodiment of the invention, the operating method further includes start counting the predetermined time after the first gate and the second gate are connected; and disconnecting the first gate and the second gate when finished counting the predetermined time.

In another embodiment of the invention, a finishing time point of the predetermined time is when the potential difference is smaller than a second predetermined value.

In view of the above, according to the invention, the first gate may have a low potential during a switching time and turn-off time through the adaptive element, so as to lower a capacitance from the gate to the drain, thereby reducing the switching loss and increasing a breakdown voltage. By means of the adaptive element, when the transistor is in the conduction state, the first gate is at high potential, so as to lower a turn-on resistance and thereby reduces the conduction loss. Hence, the adaptive duo-gate MOSFET of the invention can simultaneously reduce the switching loss and the conduction loss.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The following exemplary embodiments are provided for explaining the concepts of the invention, and are not intended for limiting the applications and the scope of the invention.

Figure 1A:
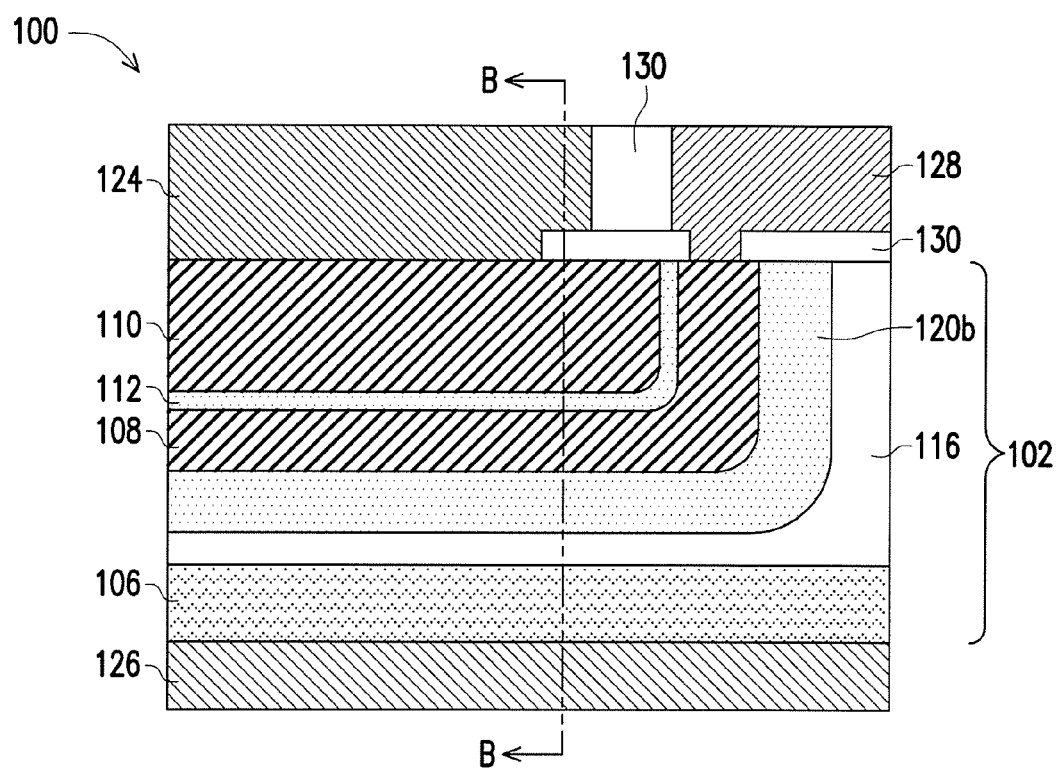
FIG. 1A is a schematic diagram illustrating a trench MOSFET of an adaptive duo-gate MOSFET according to a first embodiment of the invention.
Figure 1B:
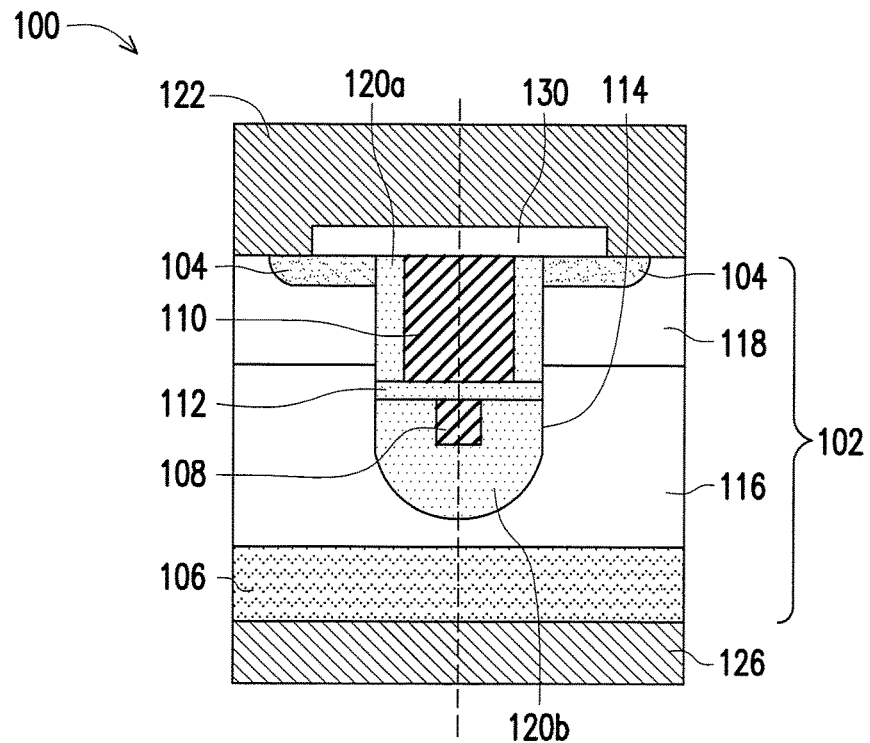
FIG. 1B is a schematic cross-sectional view along a section line B-B of FIG. 1A.

FIG. 1A is a schematic diagram illustrating a trench MOSFET of an adaptive duo-gate MOSFET according to a first embodiment of the invention, and FIG. 1B is a schematic cross-sectional view along a section line B-B of FIG. 1A.

The adaptive duo-gate MOSFET of the first embodiment includes a trench MOSFET 100 and an adaptive element. The trench MOSFET 100 can be understood by referring to FIG. 1A and FIG. 1B. The trench MOSFET 100 includes a substrate 102, a source 104, a drain 106, a first gate 108, a second gate 110 and a dielectric layer 112 between the first gate 108 and the second gate 110, wherein the dielectric layer 112 is, for example, an inter-poly dielectric (IPD) layer. The source 104 and the drain 106 are respectively located at two ends of a trench 114 within the substrate 102, the first and the second gates 108 and 110 and the dielectric layer 112 are all located in the trench 114, and the second gate 110 is located on the first gate 108 and is close to the source 104. Moreover, the substrate 102 may further include an N-type epitaxial layer 116 and a P-type well 118, wherein an intersecting portion between the N-type epitaxial layer 116 and the P-type well 118 is close to the dielectric layer 112, but the invention is not limited thereto. The first and the second gates 108 and 110 in the trench 114 and the substrate 102 have dielectric layers 120a and 120b therebetween. In addition, the source 104, the second gate 110 and the drain 106 can respectively be conducted through a source metal 122, a gate metal 124 and a drain metal 126. Moreover, a conductive metal 128 electrically coupled with the first gate 108 may also be selectively disposed. An insulating layer 130 can further be disposed between the source metal 122 and other components, between the gate metal 124 and other components, and between the conductive metal 128 and other components in the substrate 102 for providing electrical insulation.

Figure 1C:
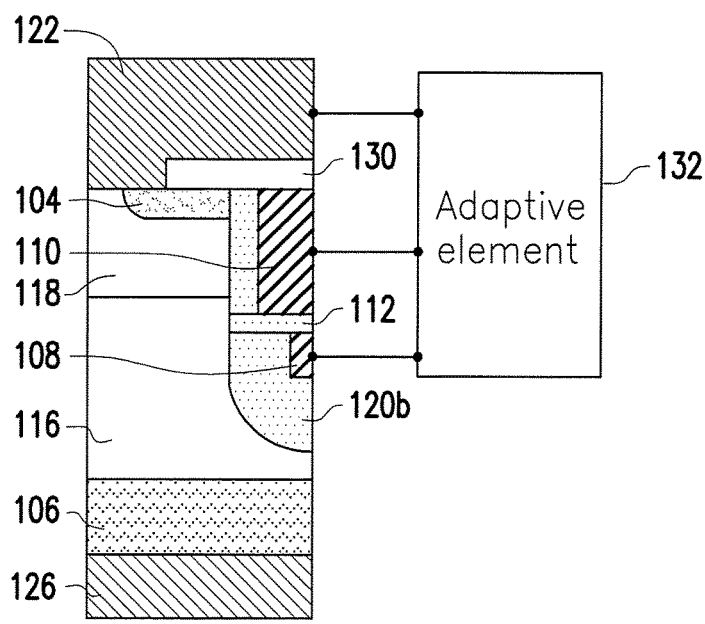
FIG. 1C is a schematic diagram illustrating the adaptive duo-gate MOSFET according to the first embodiment of the invention.

FIG. 1C is a schematic diagram of the adaptive duo-gate MOSFET of the first embodiment, wherein, for purpose of simplification, only the semi-structure defined by the dashed line shown in FIG. 1B is illustrated herein.

In FIG. 1C, the adaptive element 132 of the adaptive duo-gate MOSFET is electrically coupled to the first gate 108, the second gate 110 and the source 104, respectively. When a potential difference between the second gate 110 and the source 104 is larger than a first predetermined value, the adaptive element 132 enables the first gate 108 and the source 104 to be electrically disconnected (i.e. Open) and then enables the first and the second gates 108 and 110 to be electrically connected. Moreover, after a predetermined time, the adaptive element 132 enables the first and the second gates 108 and 110 to be electrically disconnected and then enables the first gate 108 and the source 104 to be electrically connected. The first gate 108 may generate charge-coupling in the substrate 102, and the second gate 110 may form a channel in the trench MOSFET. Detailed operation can be referred to FIG. 2.

Figure 1D:
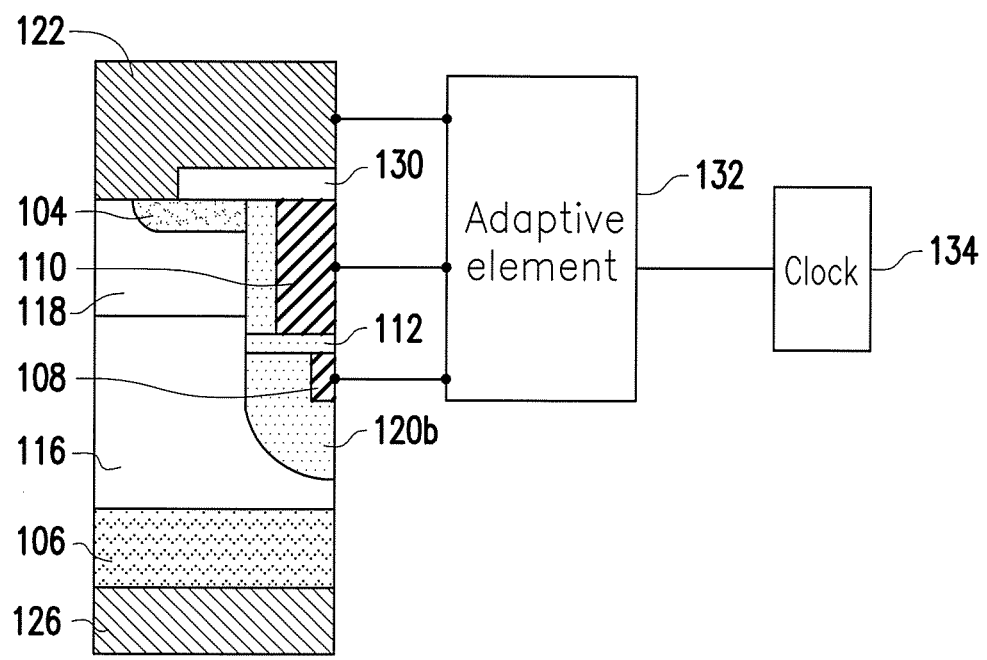
FIG. 1D is another schematic diagram illustrating the adaptive duo-gate MOSFET of FIG. 1C.

FIG. 1D is another schematic diagram of the adaptive duo-gate MOSFET of FIG. 1C, wherein same reference numerals as in FIG. 1C are used for representing the same or similar components.

In FIG. 1D, the adaptive element 132 is further coupled to a clock 134, which starts counting the predetermined time after the first gate 108 and the second gate 110 are electrically connected, and then enables the first gate 108 and the second gate 110 to be electrically disconnected when the counting the predetermined time is finished. The predetermined time may be related or unrelated to the potential difference between the second gate 110 and the source 104. Regardless of the potential difference between the second gate 110 and the source 104, it only requires to predetermine a time for electrically disconnecting the first gate 108 and second gate 110. If the adaptive duo-gate MOSFET can be accurately calibrated, then the predetermined time can be accurately corresponded to the variation of the potential difference, and thus it is possible to selectively control the electrical connection and disconnection between the first gate 108 and second gate 110 by the clock 134 directly.

Figure 2:
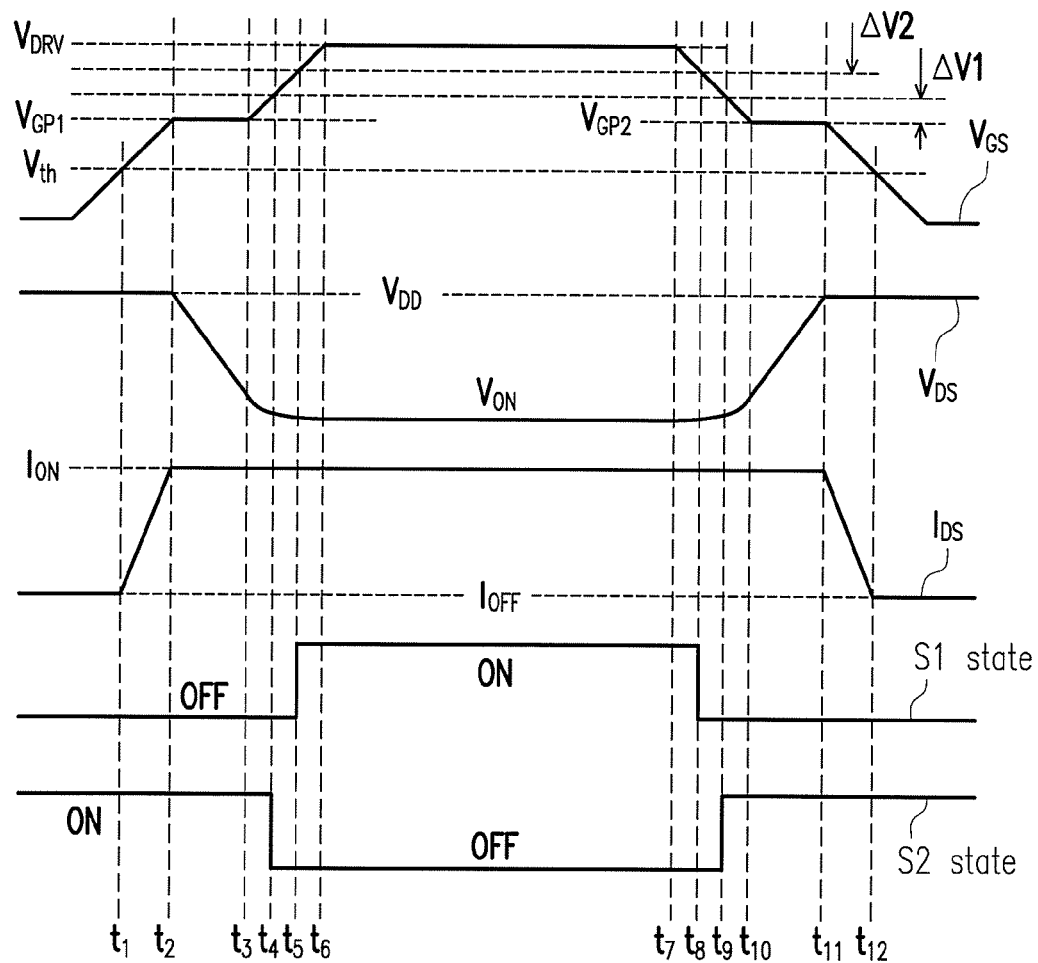
FIG. 2 is a waveform diagram of the adaptive duo-gate MOSFET of FIG. 1C, which illustrates an operating condition thereof according to a second embodiment of the invention.

FIG. 2 is a waveform diagram of the adaptive duo-gate MOSFET of FIG. 1C, which illustrates an operating condition thereof according to a second embodiment of the invention.

In FIG. 2, $V_{GS}$ (gate to source voltage) represents a voltage from the second gate to the source during the operation of the trench MOSFET, $V_{DS}$ (drain to source voltage) represents a voltage from the drain to the source during the operation of the trench MOSFET, and $I_{DS}$ (drain to source current) represents a current from the drain to the source during the operation of the trench MOSFET. S1 state shown in the lower part of FIG. 2 represents a connection state between the first gate and the second gate (ON is the electrically-connected state, OFF is the electrically-disconnected state), and S2 state represents a connection state between the first gate and the source (ON is the electrically-connected state, OFF is the electrically-disconnected state).

As accompanied by the adaptive duo-gate MOSFET of FIG. 1C, after the potential difference between the second gate 110 and the source 104 of the trench MOSFET is obtained, when the potential difference is greater than $V_{GP1}+\Delta V1$, the S2 state is OFF, such that the first gate 108 and the source 104 are in the disconnected state, and then the S1 state becomes ON, such that the first gate 108 and the second gate 110 are in the connected state. After a predetermined time is passed, the S1 state becomes OFF, and the S2 state becomes ON. This segment of predetermined time can occur after time t6. In addition, when the potential difference is smaller than $V_{GP1}+\Delta V1$, the S1 state and the S2 state may be maintained at OFF and ON, respectively. The $V_{GP2}+\Delta V2$ can be larger than or equal to $V_{GP1}+\Delta V1$. Influences of the operation shown in FIG. 2 on the MOSFET will be described in detail below.

Firstly, in a transition region, before switching the traditional MOSFET to the connected state, between a time interval from t1 to t3, an output switching loss may be larger due to higher $I_{DS}$ and $V_{DS}$. The S1 state and the S2 state of the present embodiment are respectively being the disconnected state (OFF) and the connected state (ON), and thus, at least within a time interval from t2 to t3, the first gate 108 and the source 104 of the adaptive duo-gate MOSFET of FIG. 1C have the same potential, thereby preventing a capacitance from the first gate 108 to the drain 106 from being created to add into the total gate-to-drain capacitance of the adaptive duo-gate MOSFET. Due to the reduction in the gate-to-drain capacitance, under the same cross-voltage condition, the accumulated total gate-to-drain capacitance is decreased, thereby causing the time interval from t2 to t3 to be shortened, and thus an average switching power is reduced and the problem of switching loss is improved.

Similarly, in the transition region, before switching the traditional MOSFET to the disconnected state, between a time interval from t10 to t12, an output switching loss may be larger due to high $I_{DS}$ and $V_{DS}$. The S1 state and the S2 state of the adaptive duo-gate MOSFET of FIG. 1C are respectively being the disconnected state (OFF) and the connected state (ON) during the time interval from t10 to t12, and thus, at least within the time interval from t10 to t12 time interval, the first gate 108 and the source 104 in the adaptive duo-gate MOSFET have the same potential, thereby preventing the capacitance from the first gate 108 to the drain 106 from being created to add into the total gate-to-drain capacitance of the adaptive duo-gate MOSFET. Due to the reduction in the gate-to-drain capacitance, under the same cross-voltage condition, the accumulated total gate-to-drain capacitance is decreased, thereby causing a time interval from t10 to t11 to be shortened, and thus the average switching power is reduced and the problem of switching loss is improved.

During a time interval from t6 to t7, if the S1 state and the S2 state of the adaptive duo-gate MOSFET of FIG. 1C are respectively being the connected state (ON) and the disconnected state (OFF). Since the first gate 108 and the second gate 110 both have a potential higher than that of the source 104 and the drain 106, electrons may be accumulated at an interface between the N-type epitaxial layer 116 and the insulating layer 120b, thereby further lowering a turn-on resistance.

In the present embodiment, an ON starting point of the S1 state is only required to occur after the potential ($V_{GS}$) from the second gate 110 to the source 104 is higher than $V_{GP1}+\Delta V1$ and later than an OFF starting point of the S2 state, such as later than time t6, and is not required to be limited within a short interval of t4 to t6.

Moreover, after the S1 state becomes ON, a finishing time point of the predetermined time may further be set as when the potential difference between the second gate 110 and the source 104 is smaller than $V_{GP2}+\Delta V2$. Since after switching the S1 state and the S2 state the capacitance from the first gate 108 to the drain 106 of the adaptive duo-gate MOSFET is not added up to the total gate-to-drain capacitance of the adaptive duo-gate MOSFET, following the reduction in the gate-to-drain capacitance, under the same cross-voltage condition, the accumulated total gate-to-drain capacitance is decreased, thereby causing the time interval from t10 to t11 to be shortened, and thus the average switching power is reduced and the problem of switching loss is improved.

Moreover, after the S1 state becomes ON, the predetermined time can start to be counted through using device such as a clock; and when the counting of the predetermined time is finished, the S1 state is switched to OFF. The finishing time point of the predetermined time may be any time later than time t6, or may also be with respect to the potential difference between the second gate 110 and the source 104; that is, if the predetermined time can accurately correspond to the variation of the potential difference, the clock may be selectively used to directly control the ON and Off of the S1 state.

Figure 3:
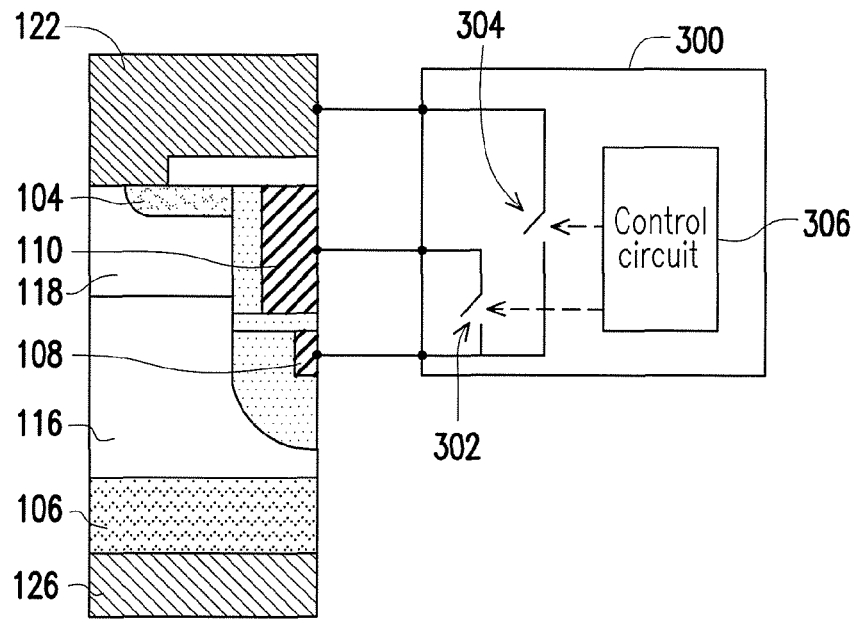
FIG. 3 is a schematic diagram illustrating an adaptive duo-gate MOSFET according to a third embodiment of the invention.

FIG. 3 is a schematic diagram illustrating an adaptive duo-gate MOSFET according to a third embodiment of the invention, wherein same reference numerals as in the first embodiment are used for representing the same or similar components.

Referring to FIG. 3, an adaptive element 300 in the present embodiment may include a first switching element 302, a second switching element 304 and a control circuit 306. The first switching element 302 is coupled to the first gate 108 and the second gate 110, and the second switching element 304 is coupled to the first gate 108 and the source 104, whereby it is connected to the source 104 through the source metal 122. The control circuit 306 may determine the ON and OFF of the first and the second switching elements 302 and 304 according to the potential difference between the second gate 110 and the source 104.

Furthermore, the trench MOSFET of the invention, in addition to the types illustrated in the aforementioned embodiments, may further use other type of trench MOSFET, and is not limited to the examples shown in the drawings.

Figure 4:
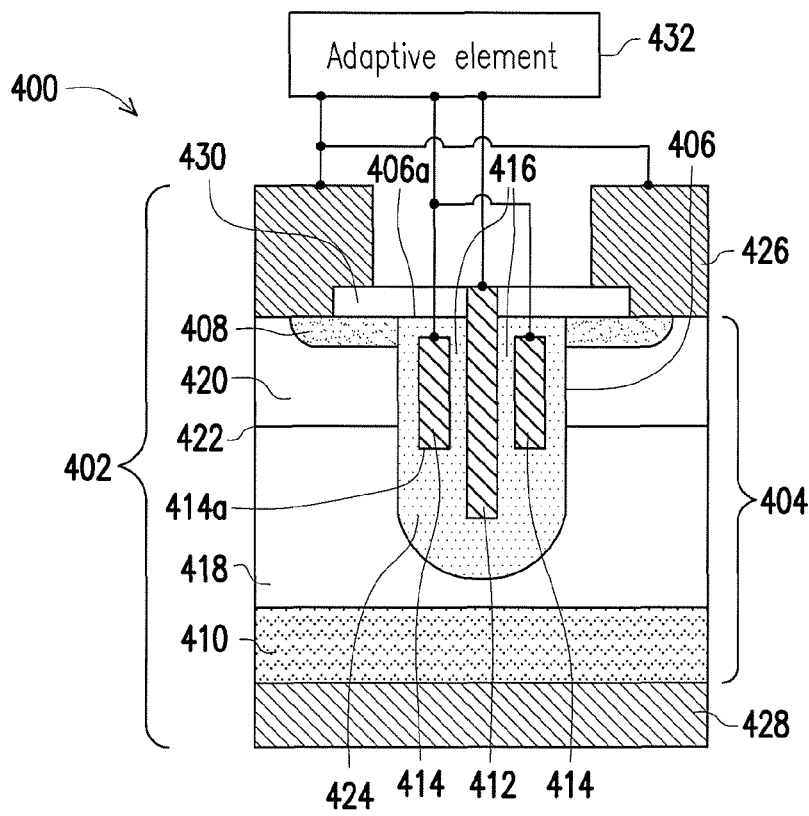
FIG. 4 is a schematic diagram illustrating an adaptive duo-gate MOSFET according to a fourth embodiment of the invention.

FIG. 4 is a schematic diagram illustrating an adaptive duo-gate MOSFET according to a fourth embodiment of the invention.

Referring to FIG. 4, a trench MOSFET 402 in an adaptive duo-gate MOSFET 400 of the fourth embodiment includes a substrate 404, a trench 406 located within the substrate 404, a source 408 and a drain 410 respectively located at two ends of the trench 406, a first gate 412 and a second gate 414 located in the trench 406, and a dielectric layer 416 between the first gate 412 and the second gate 414, wherein the dielectric layer 416 is, for example, an IPD layer. The first gate 412 is located in the trench 406 and exposes from a top surface 406a of the trench 406, and thus a metal contact of the first gate 412 can be disposed in an active region so as to reduce the area of the overall chip. The second gate 414 is conductive layers located at two sides of the first gate 412, respectively. Moreover, the substrate 404 may further include an N-type epitaxial layer 418 and a P-type well 420, wherein an intersecting portion 422 between the N-type epitaxial layer 418 and the P-type well 420 is close to a bottom part 414a of the second gate 414, but the invention is not limited thereto. The trench 406 further has other dielectric layers 424 therein for separating the first gate 412, the second gate 414, the N-type epitaxial layer 418, and the P-type well 420. In addition, the source 408 and the drain 410 can respectively be conducted through a source metal 426 and a drain metal 428. An insulating layer 430 may further be disposed between the source metal 426 and other components in the substrate 404 for providing electrical insulation.

An adaptive element 432 in the adaptive duo-gate MOSFET 400 is electrically coupled to the first gate 412, the second gate 414 and the source 408, respectively, and when a potential difference between the second gate 414 and the source 408 is larger than a first predetermined value, the adaptive element 432 enables the first gate 412 and the source 408 to be electrically disconnected and then enables the first and the second gates 412 and 414 to be electrically connected. At this moment, the adaptive duo-gate MOSFET 400 is in the electrically-connected state, which also causes the first gate 412 to be at a high potential and thereby results in an accumulation of electrons at an interface between the N-type epitaxial layer 418 and the dielectric layer 424, and thus the turn-on resistance is lowered. Moreover, when the potential difference between the second gate 414 and the source 408 is smaller than a second predetermined value, the adaptive element 432 enables the first and the second gates 412 and 414 to be electrically disconnected and then enables the first gate 412 and the source 408 to be electrically connected. At this moment, a capacitance from the first gate 412 to the drain 410 of the adaptive duo-gate MOSFET 400 is not to be added up to a total gate-to-drain capacitance of the adaptive duo-gate MOSFET 400, and thereby causes the total gate-to-drain capacitance of the adaptive duo-gate MOSFET 400 to be reduced, and thus the switching loss is lowered. Details regarding the operation can also be referred to FIG. 2, and thus will not be repeated.

Figure 5:
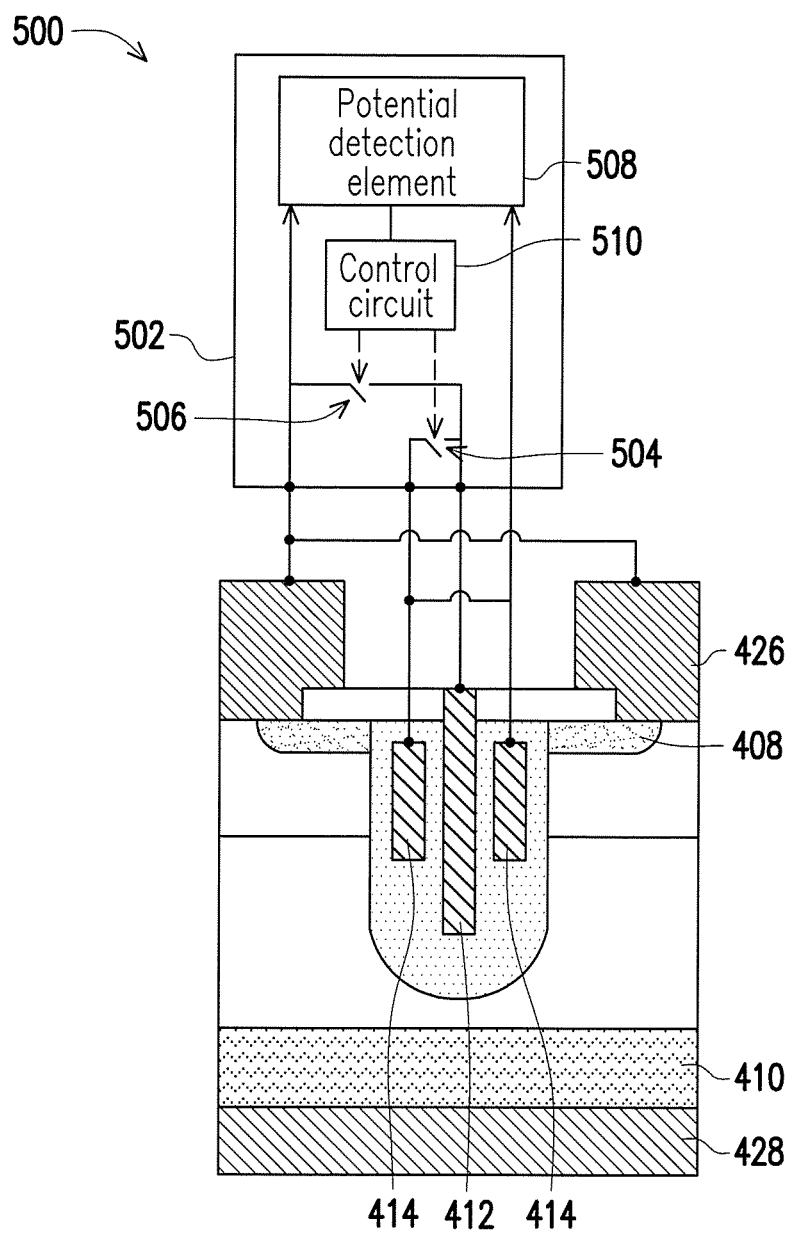
FIG. 5 is a schematic diagram illustrating an adaptive duo-gate MOSFET according to a fifth embodiment of the invention.

FIG. 5 is a schematic diagram illustrating an adaptive duo-gate MOSFET according to a fifth embodiment of the invention, wherein same reference numerals as in the fourth embodiment are used for representing the same or similar components.

In FIG. 5, a trench MOSFET in an adaptive duo-gate MOSFET 500 of the fifth embodiment is the same as that of the fourth embodiment, whereas an adaptive element 502 includes a first switching element 504, a second switching element 506, a potential detection element 508 and a control circuit 510. The first switching element 504 is coupled to the first gate 412 and the second gate 414, and the second switching element 506 is coupled to the first gate 412 and the source 408, wherein the second switching element 506 can be connected to the source 408 through the source metal 426. The potential detection element 508 can detect potentials of the second gate 414 and the source 408 and generate a potential difference signal to the control circuit 510, so the control circuit 510 can determine the ON and OFF of the first and the second switching elements 504 and 506 according to the potential difference signal.

In summary, the invention, through the adaptive element that is coupled to the trench MOSFET, can adaptively change the potential of the first gate under different conditions of the transistor, respectively, so as to reduce the switching loss and the conduction loss at the same time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An adaptive duo-gate MOSFET, comprising:
   a trench MOSFET, comprising a substrate, a trench located in the substrate, an N-type epitaxial layer and a P-type well located in the substrate, a source and a drain respectively located at two sides of the trench, a first gate and a second gate located in the trench, and a dielectric layer between the first gate and the second gate, wherein the second gate is located on the first gate and nearby the source, an intersecting portion between the N-type epitaxial layer and the P-type well is close to the dielectric layer, the first gate is configured to generate charge-coupling in the substrate, and the second gate is configured to form a channel in the trench MOSFET; and
   an adaptive element, electrically coupled to the first gate, the second gate and the source, respectively, wherein when a potential difference between the second gate and the source is equal to or under a first predetermined value, the first gate and the source are electrically connected; when the potential difference between the second gate and the source is larger than the first predetermined value, the first gate and the source are electrically disconnected and then the first gate and the second gate are electrically connected by the adaptive element, and after a predetermined time, the first gate and the second gate are electrically disconnected and then the first gate and the source are electrically connected by the adaptive element.

2. The adaptive duo-gate MOSFET as recited in claim 1, wherein the adaptive element comprises:
   a first switching element, coupled to the first gate and the second gate respectively;
   a second switching element, coupled to the first gate and the source respectively; and
   a control circuit, determining ON and OFF of the first switching element and the second switching element according to the potential difference between the second gate and the source.

3. The adaptive duo-gate MOSFET as recited in claim 2, wherein the adaptive element further comprises a potential detection element for detecting potentials of the second gate and the source and generating a potential difference signal to the control circuit.

4. The adaptive duo-gate MOSFET as recited in claim 1, further comprising a clock coupled to the adaptive element, wherein the clock starts counting the predetermined time after the first gate and the second gate are electrically connected, and the first gate and the second gate are electrically disconnected after the clock finishes counting the predetermined time.

5. The adaptive duo-gate MOSFET as recited in claim 1, wherein a finishing time point of the predetermined time is when the potential difference between the second gate and the source is smaller than a second predetermined value.

6. The adaptive duo-gate MOSFET as recited in claim 5, wherein the second predetermined value is larger than the first predetermined value.

7. The adaptive duo-gate MOSFET as recited in claim 5, wherein the second predetermined value is equal to the first predetermined value.

8. The adaptive duo-gate MOSFET as recited in claim 1, wherein the dielectric layer comprises an inter-poly dielectric (IPD) layer.

9. An operating method for the adaptive duo-gate MOSFET as recited in claim 1, the operating method comprising:
   obtaining the potential difference between the second gate and the source of the trench MOSFET;
   when the potential difference is equal to or under the first predetermined value, electrically connecting the first gate and the source;
   when the potential difference is greater than the first predetermined value, electrically disconnecting the first gate and the source;
   after the first gate and the source are disconnected, electrically connecting the first gate and the second gate;
   after a predetermined time, electrically disconnecting the first gate and the second gate; and
   after the first gate and the second gate are disconnected, electrically connecting the first gate and the source.

10. The operating method as recited in claim 9, further comprising:
    when the potential difference is smaller than the first predetermined value, maintaining a connected state between the first gate and the source and a disconnected state between the first gate and the second gate.

11. The operating method as recited in claim 9, further comprising:
    after the first gate and the second gate are connected, start counting the predetermined time; and
    when finished counting the predetermined time, disconnecting the first gate and the second gate.

12. The operating method as recited in claim 9, wherein a finishing time point of the predetermined time is when the potential difference is smaller than a second predetermined value.

* * * * *